(12) United States Patent
Iwai (10) Patent No.: US 7,508,712 B2
(45) Date of Patent: Mar. 24, 2009

(54) NONVOLATILE SEMICONDUCTOR MEMORY DEVICE AND CONTROL METHOD THEREOF

(75) Inventor: Makoto Iwai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/844,096

(22) Filed: Aug. 23, 2007

(65) Prior Publication Data

US 2008/0049509 A1 Feb. 28, 2008

(30) Foreign Application Priority Data

Aug. 23, 2006 (JP) ............................. 2006-227044

(51) Int. Cl.
*G11C 16/04* (2006.01)
(52) U.S. Cl. ..................... 365/185.17; 365/185.18; 365/185.23
(58) Field of Classification Search ............ 365/185.17, 365/185.18, 185.23, 189.09, 233.1
See application file for complete search history.

(56) References Cited

U.S. PATENT DOCUMENTS

| | | | | |
|---|---|---|---|---|
| 5,774,399 A | * | 6/1998 | Kwon ..................... | 365/185.18 |
| 6,335,902 B1 | * | 1/2002 | Nakaoka ................ | 365/233.11 |
| 6,456,561 B2 | * | 9/2002 | Maeda ................... | 365/189.05 |
| 7,064,986 B2 | * | 6/2006 | Lee et al. ............... | 365/185.28 |
| 7,071,748 B2 | * | 7/2006 | Wich ........................ | 327/176 |
| 7,423,908 B2 | * | 9/2008 | Kim et al. .............. | 365/185.23 |
| 2005/0237825 A1 | | 10/2005 | Kawajiri et al. | |
| 2007/0133288 A1 | | 6/2007 | Iwai et al. | |

FOREIGN PATENT DOCUMENTS

JP          2002-203395          7/2002

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A nonvolatile semiconductor memory device includes a memory cell array 101 having a plurality memory strings, each of said plurality of memory strings having a plurality of memory cells connected in series, each of said plurality of memory cells having a control gate, said plurality of memory cells including a read-memory cell whose programmed data is read and a plurality of non-read-memory cells other than said read-memory cell, each said control gate of each said plurality of non-read-memory cells being applied with a read pass voltage to read said programmed data programmed in said read-memory cell, a read pass voltage application control part 201 for applying a predetermined read pass voltage to the control gates of all non-read memory cells among said plurality of memory cells other than a read-memory cell whose stored data are read, and a clock signal cycle control part 203 for controlling a cycle of a clock signal which is provided to said read pass voltage application control part 201.

20 Claims, 6 Drawing Sheets

CYCLE EXTENSION PERIOD

NONVOLATILE SEMICONDUCTOR MEMORY DEVICE AND CONTROL METHOD THEREOF

CROSS-REFERENCE TO RELATED APPLICATION

This application is based upon and claims the benefit of priority from the prior Japanese Patent Application No. 2006-227044, filed on Aug. 23, 2006; the entire contents of which are incorporated herein by reference.

BACKGROUND OF THE INVENTION

1. Field of the Invention

The present invention relates to a nonvolatile semiconductor memory device having a plurality of memory cells which are connected in series and in particular, is related to a NAND flash memory device.

2. Description of the Related Art

As a semiconductor memory device there is a device which is cited in Japan patent application KOKAI publication No. 2002-203395. This semiconductor memory device is arranged with a booster circuit which includes oscillation means which generates two types of clock signal with different frequencies in response to a selection signal of an external input, and boosting means which conducts a boost operation at drive power in response to a clock signal from oscillation means. Because two types of clock signals with different frequencies are used only at the data program operation and the erasure operation in this semiconductor memory device, the power-consumption increases during data read operation.

BRIEF SUMMARY OF THE INVENTION

According to one aspect of the present invention, a nonvolatile semiconductor memory device comprises a memory cell array including a plurality of memory strings, each of said plurality of memory strings having a plurality of memory cells connected in series, each of said plurality of memory cells having a control gate, said plurality of memory cells including a read-memory cell whose programmed data is read and a plurality of non-read-memory cells other than said read-memory cell, each said control gate of each said plurality of non-read-memory cells being applied with a read pass voltage to read said programmed data programmed in said read-memory cell; a read pass voltage application control circuit for applying a voltage to said control gates of said non-read memory cells, said voltage rising gradually to a read pass voltage; and a clock signal cycle control circuit for controlling a cycle of a clock signal, said clock signal being provided to said read pass voltage application control circuit.

According to another aspect of the present invention, a nonvolatile semiconductor memory device comprises a memory cell array including a plurality of memory strings, each of said plurality of memory strings having a plurality of memory cells connected in series, each of said plurality of memory cells having a control gate, said plurality memory cells including a read-memory cell whose programmed data is read and a plurality of non-read-memory cells other than said read-memory cell, said control gate of each of said plurality of non-read-memory cells being applied with a read pass voltage to read said programmed data programmed in said read-memory cell; a charge pump circuit for generating a voltage applied to said control gates of said plurality of non-read memory-cells, said voltage being boosted to said read pass voltage; a plurality of transmission transistors, each of said plurality of transmission transistors transmitting said read pass voltage to said control gate of each of said plurality of non-read memory cells; a plurality of local pump circuits, each of said plurality of local pump circuits generating voltages applied to said control gate of each of said plurality of transmission transistors in response to a clock signal; and a clock signal cycle control circuit for controlling a cycle of said clock signal.

According to another aspect of the present invention, a control method of a nonvolatile semiconductor memory device, said nonvolatile semiconductor memory device including a memory cell array having a plurality of memory strings, each of said plurality of memory strings having a plurality of memory cells connected in series, each of said plurality of memory cells having a control gate, said plurality of memory cells including a read-memory cell whose programmed data is read and a plurality of non-read-memory cells other than said read-memory cell, each control gates of said plurality of non-read-memory cells being applied a read pass voltage to read said programmed data programmed in said read-memory cell, said control method comprising: applying a voltage to each of said control gates of said plurality of non-read memory cells, said voltage boosting to said read pass voltage; and controlling a cycle of a clock signal provided to generate said read pass voltage.

DETAILED DESCRIPTION OF THE INVENTION

Below, a nonvolatile semiconductor memory device relating to one embodiment of this invention is explained in detail with reference to the drawings. Further, the present invention is not limited to the embodiment below.

Figure 1:
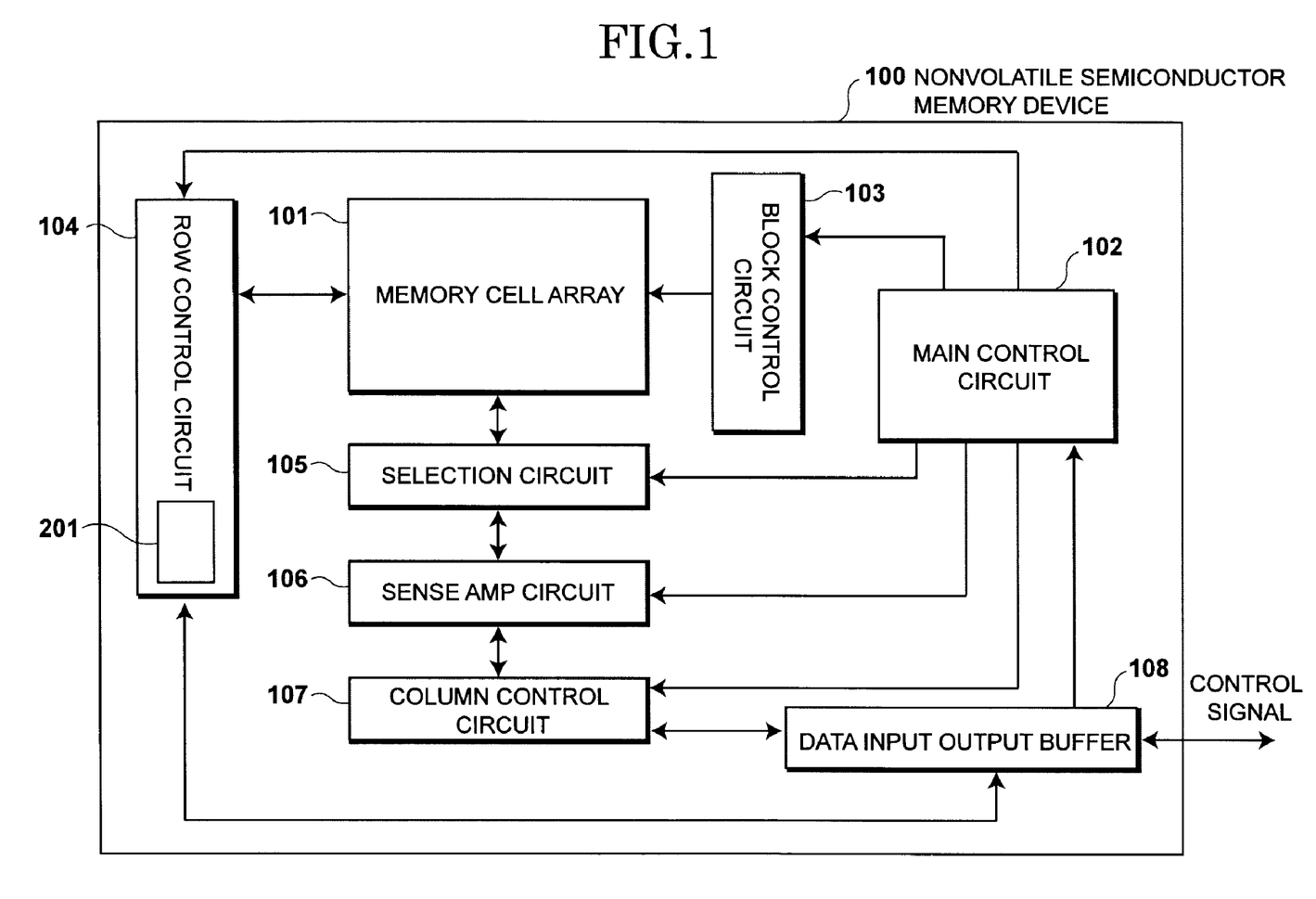
FIG. 1 is a block diagram which shows a construction of a nonvolatile semiconductor memory device relating to one embodiment of this invention.

FIG. 1 shows a block diagram of a construction of a nonvolatile semiconductor memory device relating to one embodiment of this invention.

As is shown in FIG. 1, a nonvolatile semiconductor memory device 100 relating to one embodiment of this invention includes a memory cell array 101, a main control part (main control circuit) 102, a block control circuit 103, a row control circuit 104, a selection circuit 105, a sense amp circuit 106, a column control circuit 107 and a data input output buffer 108.

The main control part 102 controls the block control circuit 103, the row control circuit 104, the selection circuit 105, the sense amp circuit 106 and the column control circuit 107 based on a control signal received from the data input/output buffer 108 and conducts a data program operation, a read operation and an erasure operation on the memory cell array 101.

The row control circuit 104 controls a voltage which is applied to the word lines of the memory cell array 101 at the times of a data program operation, a read operation and an erasure operation on the memory cell array 101. And, the row control circuit 104 includes a read pass voltage application control part (read pass voltage application control circuit) 201. The read pass voltage application control circuit applies a voltage, when a memory cell of the plurality of memory cells which form the memory cell array 101 is selected and the data programmed in the selected memory cell is read, to non-selected memory cells other than the selected memory cell. Further, below, there are cases where a selected memory cell is called a read-memory cell and a non-selected memory cell other than a selected memory cell is called a non-read-memory cell.

Figure 2:
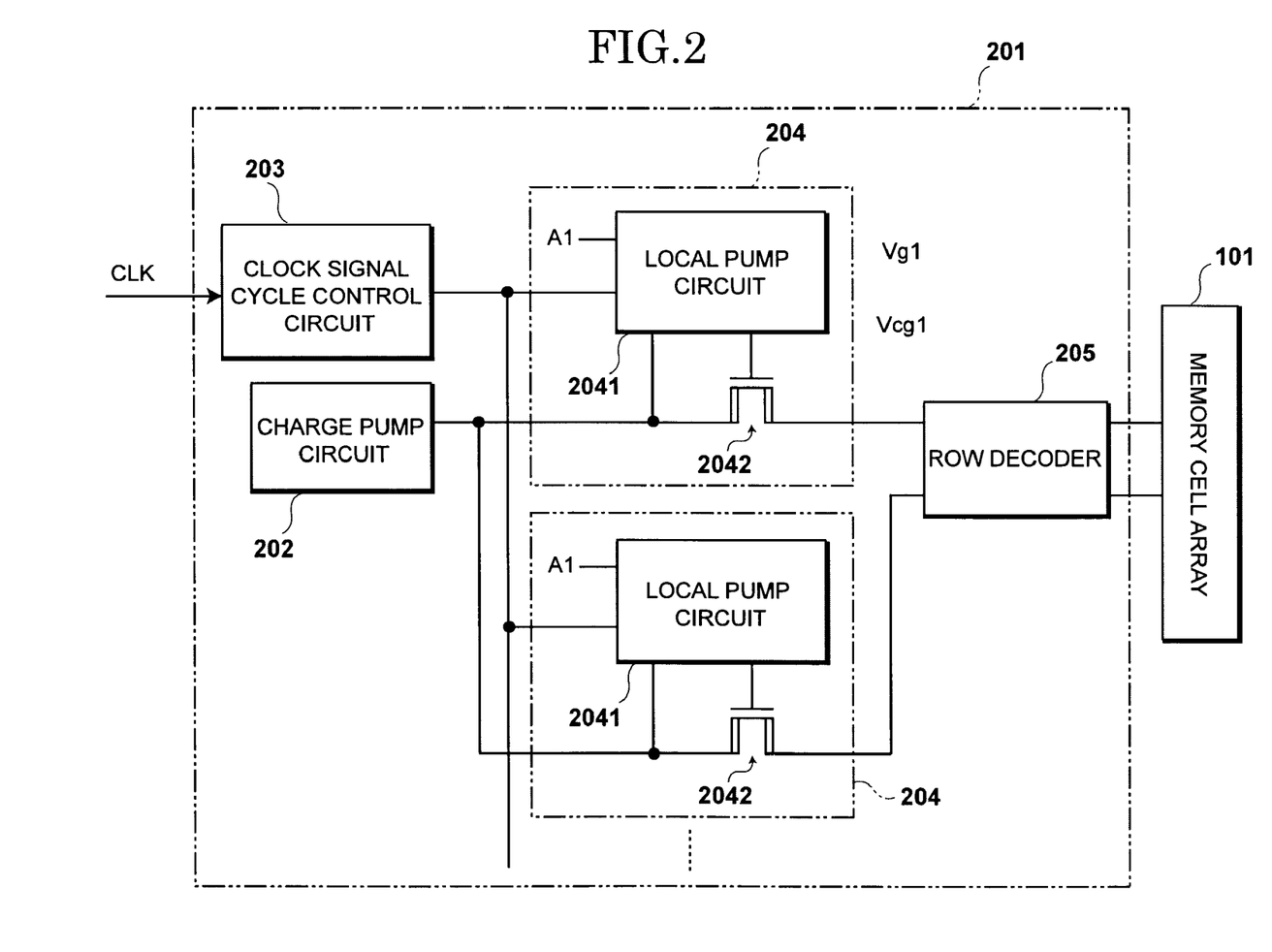
FIG. 2 is a block diagram which shows a construction of a read pass voltage application control part (circuit) of a nonvolatile semiconductor memory device relating to one embodiment of this invention.

As is shown in FIG. 2, the read pass voltage application control circuit 201 includes a charge pump circuit 202, a clock signal cycle control circuit 203, a plurality of control gate driver circuits 204 (GC driver circuits) and a row decoder 205.

Each of the plurality of GC driver circuits 204 is arranged with a local pump circuit 2041 and a transistor 2042. It is preferred that the transistor 2042 is an enhancement type N channel transistor used for high voltages. The drain of the transistor 2042 is connected to an output terminal of the charge pump circuit 202. A node which connects the drain of the transistor 2042 and the output terminal of the charge pump circuit 202 is connected to a control terminal of the local pump circuit 2041.

The output terminal of the local pump circuit 2041 is connected to the control gate of the transistor 2042. The source of the transistor 2042 is connected to an input terminal of the row decoder 205. An output terminal of the row decoder 205 is connected to the word lines or the selection gates of the memory cell array 101.

The charge pump circuit 202 generates a read pass voltage and provides the generated voltage, which is boosted to the read pass voltage, to the drain of the transistor 2042 (transmission transistor). The clock signal cycle control circuit 203 receives a clock signal CLK from its outside and controls the cycle of this clock signal CLK. And, the clock signal CLK is provided to the local pump circuit 2041 after the cycle has been controlled. The local pump circuit 2041 receives an ON/OFF control signal A1 from a control device (not shown in the drawings) which controls its ON and OFF modes.

The local pump circuit 2041 controls the transistor 2042, which transmits the read pass voltage output from the charge pump circuit 202 to the row decoder 205. The transistor 2042 transmits the read pass voltage, which is input to the drain from the charge pump circuit 202, to the row decoder 205 and is conducted by a gate voltage which is input to the control gate from the local pump circuit 2041. The row decoder 205 provides the read pass voltage transmitted from the transistor 2042 to predetermined word lines of the memory cell array 101, which transmit the read pass voltage to non-read-memory cells.

Figure 3:
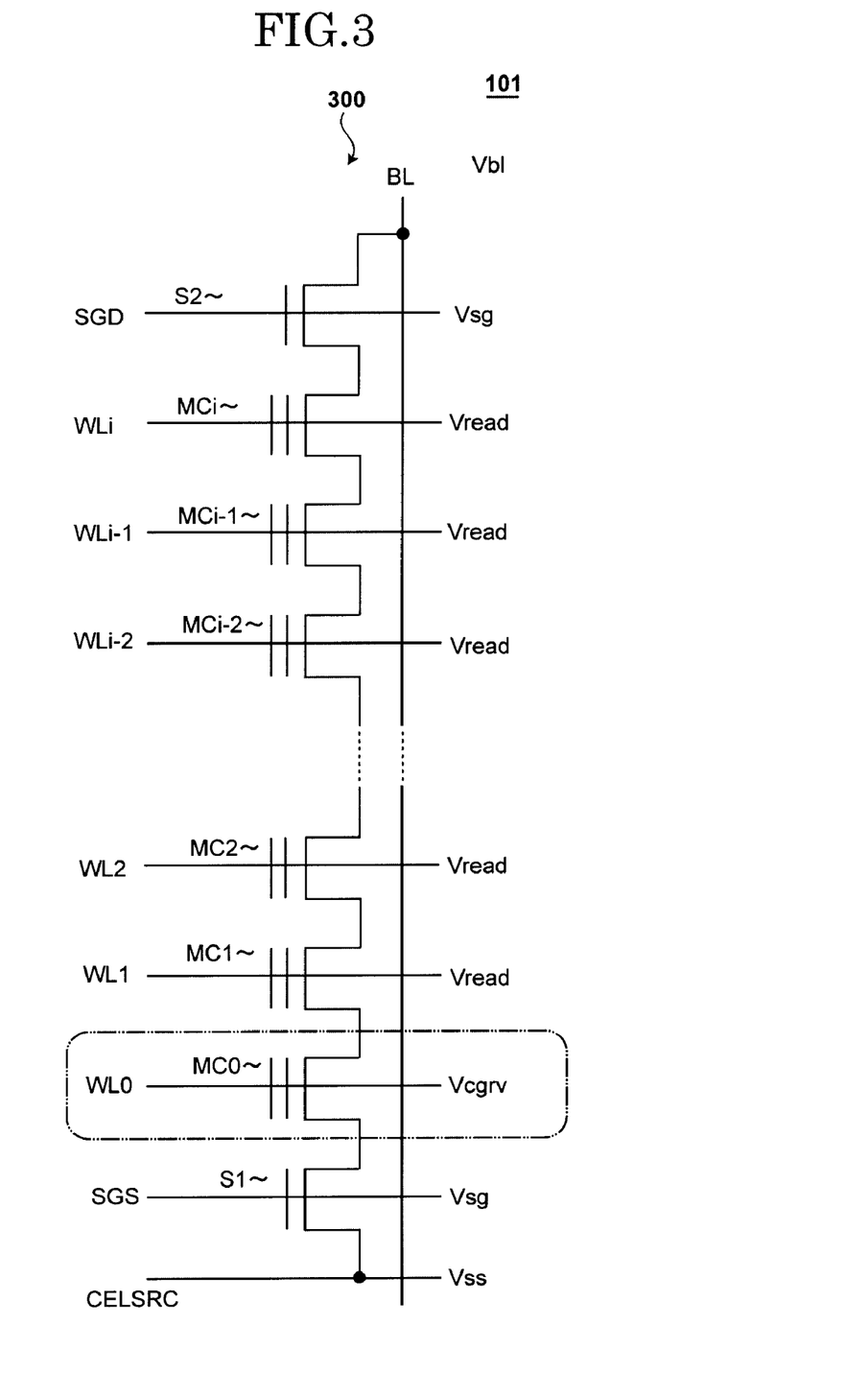
FIG. 3 is a block diagram which shows one example of a NAND cell string unit of a memory cell array of a nonvolatile semiconductor memory device relating to one embodiment of this invention.

As is shown is FIG. 3, the memory cell array 101 is arranged with a plurality of NAND cell string units 300 (memory cell string). In FIG. 3 an example of one NAND cell sting unit 300 is shown.

The NAND cell string unit 300 is arranged with a selection gate transistor S1 which is connected to a common source line CELSRC, a selection gate transistor S2 which is connected to a bit line BL and a plurality of memory cells MC0 to MCi, which are connected in series between the two selection gate transistors S1 and S2.

A selection gate line SGS is connected to the control gate of the selection gate transistor S1. A selection gate line SGD is connected to the control gate of the selection gate transistor S2. The word lines WL0 to WLi are connected to the control gates of the plurality of memory cells MC0 to MCi.

The voltage of the word lines WL0 to WLi and the voltage of the selection lines SGS and SGD are controlled by the row decoder circuit 104 at the time of data program and data read of the memory cells MC0 to MCi of the NAND cell string unit 300. A memory cell of the memory cells MC0 to MCi of the NAND cell memory unit is selected and the voltage of the word lines among WL0 to WLi which are connected to memory cells other than the selected cell at the time of data read is controlled by the read pass voltage application control part 201.

The local pump circuit 2041 of the read pass voltage application control circuit 201 operates while receiving a clock signal CLK at the time of reading programmed data programmed in the read-memory cell, and gradually boosts the gate voltage which controls the transistor 2042 to a predetermined voltage level. The boost speed of the gate voltage generated by the local pump circuit 2041 depends on the cycle of the clock signal CLK which the local pump circuit 2041 receives. The shorter the cycle of the clock signal CLK becomes, the higher the boost speed of the gate voltage generated by the local pump circuit 2041 becomes.

Next, one example of controlling voltages applied to the word lines WL0 to WLi and the voltage applied to the selection lines SGS and SGD at the time of reading the programmed data programmed in the memory cells MC0 of the NAND cell string unit 300, is explained.

The example is explained focusing on the memory cell MC0 which is connected to the word line WL0 of the NAND cell string unit 300 shown in FIG. 3 and on the data read operation of data programmed in this memory cell MC0.

When data is read which is programmed in the memory cell MC0 of the NAND cell string unit 300, the row control circuit 104 sets the voltage of the word line WL0 of the selected memory cell MC0 to be Vcgrv (for example, 0V) and the voltages of the word lines WL1 to WLi of the non-selected memory cells MC1 to MCi other than the selected memory cell to be the read pass voltage Vread (for example, 5V).

Further, the row control circuit 104 sets the voltages of the selection gate lines SGS, SGD of the selection gate transistors S1 and S2 to be Vsg (for example, 4V). The row control circuit 104 makes the non-selected memory cells MC1 to MCi and the selection gate transistors S1 and S2 ON by applying the voltage Vsg. At this time, by detecting a voltage change of the bit line BL by discharging or not discharging a charge which has been pre-charged into the bit line BL, the sense amp circuit 106 detects a data "0" or a data "1" which is programmed in the memory cell MC0.

Figure 4:
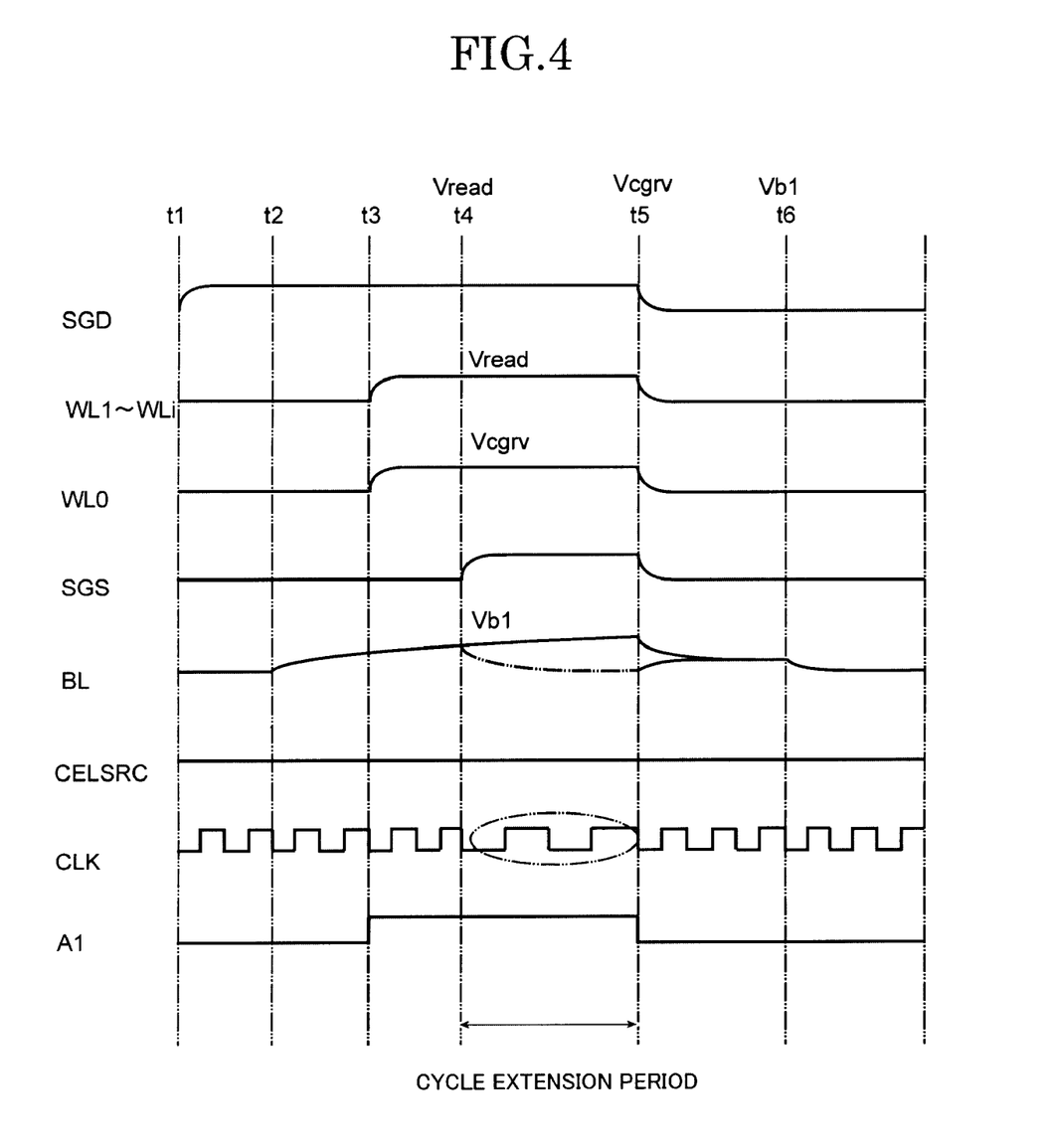
FIG. 4 is a timing chart for explaining the operation of a read pass voltage application control part (circuit) of a nonvolatile semiconductor memory device relating to one embodiment of this invention.

Next, one example of the control of the voltages of the word lines WL0 to WLi and the voltages of the selection lines SGS and SGD at the time of reading data programmed in the memory cell MC0 of the NAND cell string unit 300, is further explained in detail with reference to the drawings. FIG. 4 shows a timing chart at the time of data read of the memory cell WL0 of the NAND cell string unit 300.

As is shown in FIG. 4, at the time t1 the row control circuit 104 charges the selection gate line SGD and makes the selection gate transistor S2 ON. At the time t2, the row control circuit 104 pre-charges the bit line BL and sets that voltage to be Vb1.

At the time t3, the row control circuit 104 charges the word line WL0 of the selected memory cell MC0 with the read voltage Vcgrv. Further, at the time t3, the row control circuit 104 charges the word lines WL1 to WLi of the non-selected memory cells MC1 to MCi so that their voltages become Vread.

Between the time t3 and the time t4, the row control circuit 104 applies predetermined voltages to the word line WL0 of the selected memory cell MC0 and the word lines WL1 to WLi of the non-selected memory cells MC1 to MCi. Following this, at the time t4, the row control circuit 104 charges the selection line SGS of the selection gate transistor S1.

When the selection gate transistor S1 becomes ON, by detecting whether or not a voltage of the bit line BL is Vb1, which corresponds to the data programmed in the selected memory cell MC0, the sense amp circuit 106 detects a data "0" or a data "1" which is programmed in the memory cell MC0. By this detection, the data programmed in the memory cell MC0 is read.

In the case where the NAND cell string unit 300 is formed with 32 memory cells, the number of non-selected memory cells is 31. In other words, there needs to be exist a circuit which transmits Vread to each of 31 word lines respectively.

An enhancement type N type channel transistor used for high voltage, for example, is used as the transistor 2042 which transmits Vread. In this case, in order to transmit Vread, the voltage Vg1 which should be applied to the control gate of the transistor 2042 needs to be more than the voltage of the threshold voltage of the enhancement type N channel transistor 2042, which for example is used for high voltages, added together with Vread. That is, there is a need for Vg1≧Vread+Vt_hvne to be established. In order to generate this voltage Vg1 the local pump circuit 2041 is used.

Figure 5:
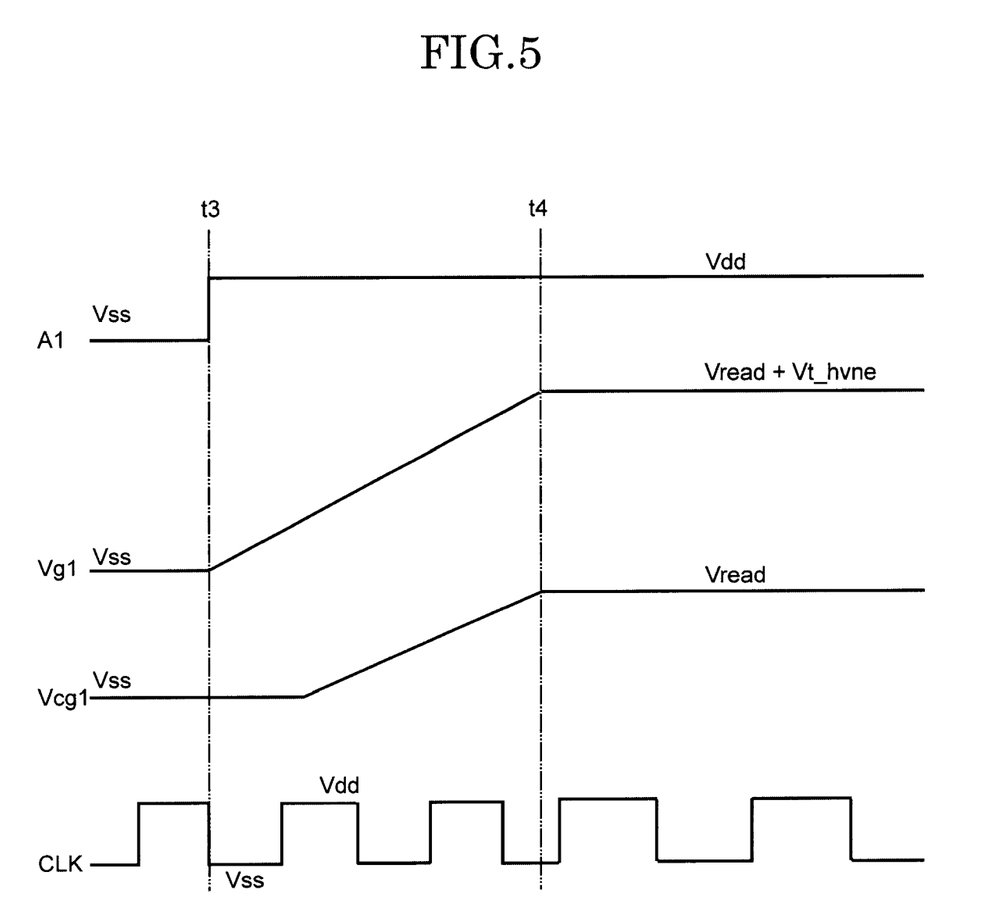
FIG. 5 is a timing chart for explaining the operation of a read pass voltage application control part (circuit) of a nonvolatile semiconductor memory device relating to one embodiment of this invention.

FIG. 5 shows a timing chart in order to explain the operation of the read pass voltage application control part 201 which is arranged with the local pump circuit 2041 shown in FIG. 2.

As is shown in FIG. 5, the local pump circuit 2041 begins operation when it receives a high level, which is a voltage higher than Vss, as the level of ON/OFF control signal A1 at the time t3. The local pump circuit 2041 operates while receiving a clock signal, and gradually boosts the gate voltage up to a predetermined voltage level in order to control the transistor 2042 at the time of data read of a memory cell. The boost speed of the gate voltage generated by the local pump circuit 2041 depends on a cycle of the clock signal CLK which the local pump circuit 2041 receives. The shorter a cycle of the clock signal CLK becomes, the higher the boost speed of the gate voltage by the local pump circuit 2041 becomes, The local pump circuit 2041 gradually boosts the gate voltage and when, for example, the voltage (Vlead+Vt_hvne) is charged to the control gate of the transistor 2042, the voltage Vcg1 of the output side terminal of the transistor 2042 becomes Vread. The local pump circuit 2041 boosts the desired voltage until, for example, (Vlead+Vt_hvne) at the time t4. Then, the clock signal cycle control circuit 203 makes the cycle of the clock signal CLK after the time t4 longer than the cycle of the clock signal CLK before the time t4. In other words, the clock signal cycle control circuit 203 extends the cycle of the clock signal CLK after the time t4.

In addition, as is shown in FIG. 4 and FIG. 5, the time t4 can also be called a read pass voltage arrival time when the output voltage of the transistor 2042 of the read pass voltage application control part 201 reaches the read pass voltage for reading data programmed in a memory cell. That is, the clock signal cycle control circuit 203 makes the cycle of the clock signal CLK, after the read pass voltage arrival time, longer than the cycle of the clock signal CLK before the read pass voltage arrival time. In other words the clock signal cycle control circuit 203 extends the cycle of the clock signal CLK after the read pass voltage arrival time.

After the time t4, the boosting of the local pump circuit 2041 ends and the output voltage of the transistor 2042 reaches the read pass voltage for reading the data of a memory cell. Also, the transmission of the voltage Vread to word lines of non-selected memory cells ends. As a result, even if the cycle of the clock signal CLK becomes longer (ie., the cycle of the clock signal CLK is extended), the data read operation of a memory cell does not become slow.

Then, as is shown in FIG. 4, the clock signal cycle control circuit 203 makes the cycle of the clock signal CLK after the read pass voltage arrival time longer than the cycle of the clock signal CLK before the read pass voltage arrival time during the period from the time t4 up to the time t5, which may be called a cycle extension period. After the cycle extension period, the clock signal cycle control circuit 203 restores the cycle of the clock signal CLK, which was made longer, to the cycle of the clock signal CLK before the arrival of the read voltage (the time t4). For example, the length of cycle of the clock signal CLK after the cycle extension period is restored to the same or about the same as the cycle of the clock signal CLK before the read pass voltage arrival time. In this way, the clock signal cycle control circuit 203 is made ready for the following read operation etc.

In one embodiment of the present operation, because a cycle of the clock signal after the read pass voltage arrival time when the output voltage of the GC driver circuit 24 reached the read pass voltage which reads the data of a memory cell, is made longer than the cycle of the clock signal before the read pass voltage arrival time, it is possible to reduce the number of times in which an electric current by a charge and a discharge or a shoot-through current flows.

In the case where the construction of the example stated above is applied to a NAND flash memory device, the greater the number of non-selected memory cells to which the read pass voltage Vread are transmitted the more it is possible to reduce the power-consumption.

Figure 6:
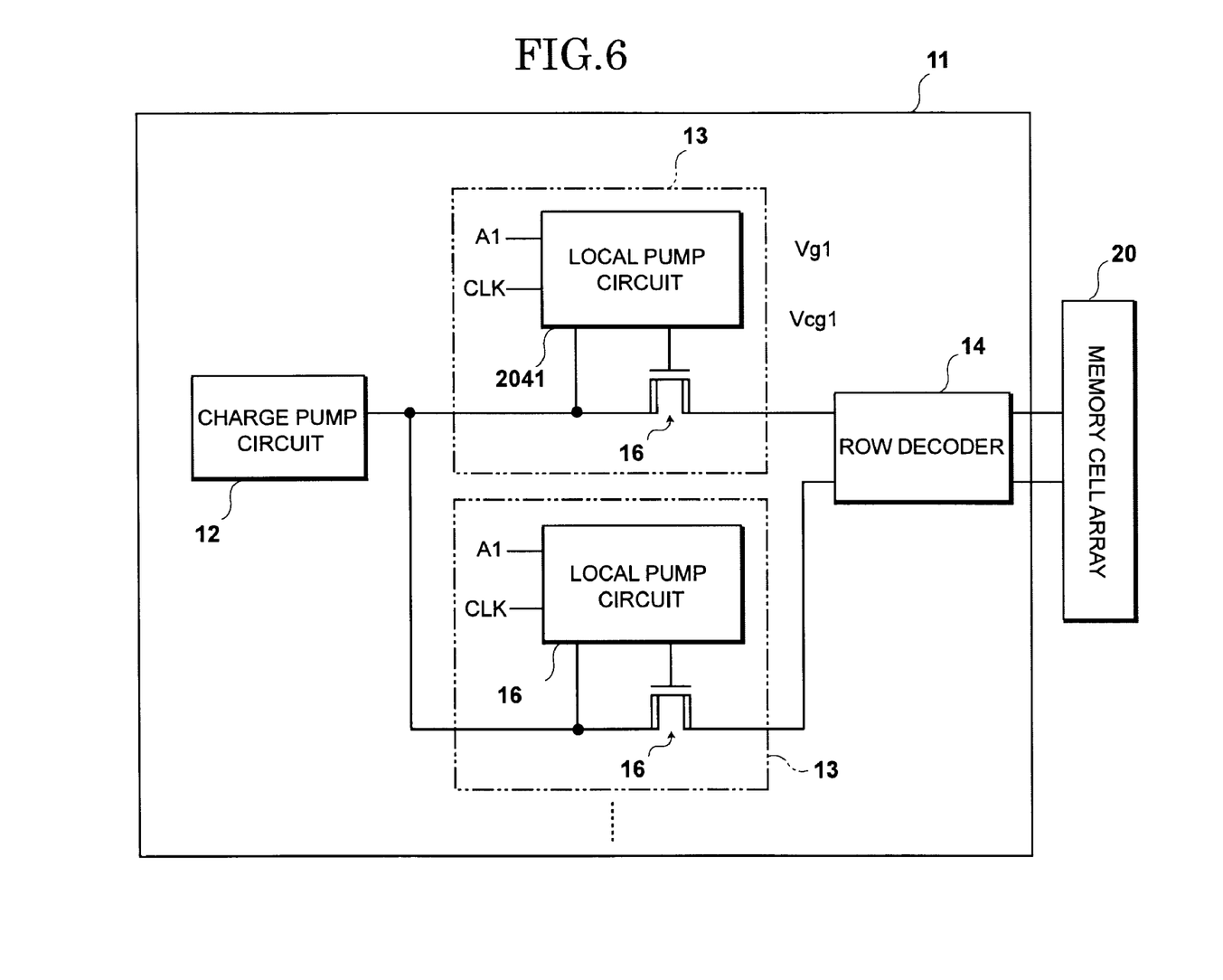
FIG. 6 is a block diagram which shows another construction of a read pass voltage application control part (circuit) of a nonvolatile semiconductor memory device relating to one embodiment of this invention.

In order to compare the construction of the read pass voltage application control part 201 relating to one embodiment stated above, an example construction of another read pass voltage application control part is shown in FIG. 6 below.

As is shown in FIG. 6, the read pass voltage application control part 11 is equipped with a charge pump circuit 12, a plurality of control gate driver circuits 13 (GC driver circuit) and a row decoder 14. Each of the plurality of GC driver circuits 13 includes a local pump circuit 15 and a transistor 16. The local pump circuit 15 controls the transistor 16 and provides the read pass voltage from the charge pump circuit 12 to the row decoder 14. The row decoder 14 provides the read pass voltage from the charge pump circuit to the predetermined word lines of the memory cell array 20 via the transistors 16 where the gate voltages are controlled via the row decoder 15.

The local pump circuit 15 of the read pass voltage application control part 11 operates while receiving a clock signal CLK at the time of data read of a memory cell. In that operation, the local pump circuit 15 gradually boosts the gate voltage of the transistor 16 up to a predetermined voltage level which controls the transistor 16. The local pump circuit 15 receives a fixed cycle clock signal CLK and operates, at the time of data read of a memory cell. Then, the boost speed of the gate voltage of the transistor 16 by the local pump circuit 15 depends on the cycle of the clock signal CLK which the local pump circuit 15 receives. The shorter the cycle of the clock signal CLK becomes, the higher the boost speed of the gate voltage of the transistor 16 by the local pump circuit 15 becomes.

In addition, the local pump circuit 15 has a plurality of inverters. These inverters receive a clock signal CLK. A shoot-through current flows to these inverters when the clock signal CLK shifts from a high level to a low level or from a low level to a high level. As a result, the power-consumption of these inverters depends on the cycle of the clock signal CLK.

In the read pass voltage application control part 11 shown in FIG. 6, because the power-consumption of the local pump circuit 15 depends on the cycle of the clock signal CLK received externally, applying the clock signal cycle control circuit 203, the same as in the above stated embodiment, by making the cycle of the clock signal CLK after the read pass voltage arrival time longer than the cycle of the clock signal CLK before the read pass voltage arrival time, a reduction in power-consumption becomes possible.

What is claimed is:

1. A nonvolatile semiconductor memory device comprising:
   a memory cell array including a plurality of memory strings, each of said plurality of memory strings having a plurality of memory cells connected in series, each of said plurality of memory cells having a control gate, said plurality of memory cells including a read-memory cell whose programmed data is read and a plurality of non-read-memory cells other than said read-memory cell, each said control gate of each said plurality of non-read-memory cells being applied with a read pass voltage to read said programmed data programmed in said read-memory cell;
   a read pass voltage application control circuit for applying a voltage to said control gates of said non-read memory cells, said voltage boosting to said read pass voltage; and
   a clock signal cycle control circuit for controlling a cycle of a clock signal, said clock signal being provided to said read pass voltage application control circuit.

2. The nonvolatile semiconductor memory device according to claim 1, wherein said clock signal cycle control circuit controls said cycle of said clock signal to be different before and after an output voltage output by said read pass voltage application control circuit reaches said read pass voltage.

3. The nonvolatile semiconductor memory device according to claim 2, wherein said clock signal cycle control circuit restores after said programmed data programmed in said read-memory cell is read said cycle of said clock signal to the cycle of said clock signal before said output voltage has reached said read pass voltage.

4. The nonvolatile semiconductor memory device according to claim 1, wherein said clock signal cycle control circuit extends said cycle of said clock signal after said output voltage output by said read pass voltage application control circuit has reached said read pass voltage.

5. The nonvolatile semiconductor memory device according to claim 4, wherein said clock signal cycle control circuit restores after said programmed data is read said cycle of said clock signal to the cycle of said clock signal before said output voltage has reached said read pass voltage.

6. The nonvolatile semiconductor memory device according to claim 1, further comprising a plurality of transmission transistors, each of said plurality of transmission transistors transmitting said read pass voltage to each of said plurality of non-read-memory cells, each of said plurality of transmission transistors having a control gate,
   wherein said clock signal cycle control circuit includes a plurality of local pump circuits, each of said plurality of local pump circuits generating a voltage applied to said control gate of each of said plurality of transmission transistors in response to said clock signal.

7. The nonvolatile semiconductor memory device according to claim 6, wherein said each of said plurality of transmission transistors is an enhancement type N channel transistor used for high voltages.

8. The nonvolatile semiconductor memory device according to claim 1, wherein said nonvolatile semiconductor memory device is a NAND type flash memory device.

9. A nonvolatile semiconductor memory device comprising:
   a memory cell array including a plurality of memory strings, each of said plurality of memory strings having a plurality of memory cells connected in series, each of said plurality of memory cells having a control gate, said plurality memory cells including a read-memory cell whose programmed data is read and a plurality of non-read-memory cells other than said read-memory cell, said control gate of each of said plurality of non-read-memory cells being applied with a read pass voltage to read said programmed data programmed in said read-memory cell;
   a charge pump circuit for generating a voltage applied to said control gates of said plurality of non-read memory-cells, said voltage being boosted to said read pass voltage;
   a plurality of transmission transistors, each of said plurality of transmission transistors transmitting said read pass voltage to said control gate of each of said plurality of non-read memory cells;
   a plurality of local pump circuits, each of said plurality of local pump circuits generating voltages applied to said control gate of each of said plurality of transmission transistors in response to a clock signal; and
   a clock signal cycle control circuit for controlling a cycle of said clock signal.

10. The nonvolatile semiconductor memory device according to claim 9, wherein said clock signal cycle control circuit controls said cycle of said clock signal to be different before and after an output voltage output by said charge pump circuit reaches said read pass voltage.

11. The nonvolatile semiconductor memory device according to claim 10, wherein said clock signal cycle control circuit restores after said programmed data programmed in said read-memory cell is read said cycle of said clock signal to the cycle of said clock signal before said output voltage has reached said read pass voltage.

12. The nonvolatile semiconductor memory device according to claim 9, wherein said clock signal cycle control circuit extends said cycle of said clock signal after said output voltage output by said charge pump circuit reaches said read pass voltage.

13. The nonvolatile semiconductor memory device according to claim 12, wherein said clock signal cycle control circuit restores after said programmed data programmed in said read-memory cell is read said cycle of said clock signal to the cycle of said clock signal before said output voltage has reached said read pass voltage.

14. The nonvolatile semiconductor memory device according to claim 9, wherein each of said plurality of transmission transistors is an enhancement type N channel transistor use for high voltages.

15. The nonvolatile semiconductor memory device according to claim 9 wherein said nonvolatile semiconductor memory device is a NAND type flash memory device.

16. A control method of a nonvolatile semiconductor memory device, said nonvolatile semiconductor memory device including a memory cell array having a plurality of memory strings, each of said plurality of memory strings having a plurality of memory cells connected in series, each of said plurality of memory cells having a control gate, said plurality of memory cells including a read-memory cell whose programmed data is read and a plurality of non-read-memory cells other than said read-memory cell, each control gates of said plurality of non-read-memory cells being applied a read pass voltage to read said programmed data programmed in said read-memory cell, the control method comprising:

applying a voltage to each of said control gates of said plurality of non-read memory cells, said voltage boosting to said read pass voltage; and controlling a cycle of a clock signal provided to generate said read pass voltage.

17. The control method of a nonvolatile semiconductor memory device according to claim 16, wherein said cycle of said clock signal is controlled to be different before and after applying said read pass voltage to each of said control gates of said plurality of non-read memory cells.

18. The control method of a nonvolatile semiconductor memory device according to claim 17, wherein said cycle of said clock signal is controlled to be restored after said programmed data programmed in said read-memory cell is read to the cycle of said clock signal before applying said read pass voltage to each of said control gates of said plurality of non-read memory cells.

19. The control method of a nonvolatile semiconductor memory device according to claim 16, wherein said cycle of said clock signal is extended after applying said read pass voltage to each of said control gates of said plurality of non-read-memory cells.

20. The control method of a nonvolatile semiconductor memory device according to claim 19, wherein said cycle of said clock signal is controlled to be restored after said programmed data programmed in said read-memory cell is read to the cycle before applying said read pass voltage to each of said control gates of said plurality of non-read-memory cells.

* * * * *